United States Patent [19]
Gupta et al.

[11] Patent Number: 6,159,333
[45] Date of Patent: *Dec. 12, 2000

[54] SUBSTRATE PROCESSING SYSTEM CONFIGURABLE FOR DEPOSITION OR CLEANING

[75] Inventors: Anand Gupta, Phoenix, Ariz.; Srihari Ponnekanti; Gana A. Rimple, both of Santa Clara, Calif.; Laxman Murugesh, Fremont, Calif.

[73] Assignee: Applied Materials, Inc., Santa Clara, Calif.

[ * ] Notice: This patent is subject to a terminal disclaimer.

[21] Appl. No.: 09/169,058

[22] Filed: Oct. 8, 1998

[51] Int. Cl.⁷ .................................................. C23F 1/02
[52] U.S. Cl. .................. 156/345; 134/1.2; 118/723 E
[58] Field of Search .............. 156/345; 134/1.1, 134/1.2, 1.3; 118/723 E, 715, 719, 723.1, 663, 697, 698

[56] References Cited

U.S. PATENT DOCUMENTS

| | | | |
|---|---|---|---|
| 4,786,352 | 11/1988 | Benzing | 156/345 |
| 5,000,113 | 3/1991 | Wang et al. | 118/723 |
| 5,024,748 | 6/1991 | Fujimura | 204/298.3 |
| 5,041,311 | 8/1991 | Tsukune et al. | 427/255.3 |
| 5,098,245 | 3/1992 | Toro-Lira et al. | 414/217 |
| 5,158,644 | 10/1992 | Cheung et al. | 156/643 |
| 5,240,555 | 8/1993 | Kilburn | 156/643 |
| 5,269,881 | 12/1993 | Sekiya et al. | 156/643 |
| 5,304,248 | 4/1994 | Cheng et al. | 118/728 |
| 5,366,585 | 11/1994 | Robertson et al. | 156/643 |
| 5,405,491 | 4/1995 | Shahvandi et al. | 156/643 |
| 5,555,717 | 9/1996 | Zhao et al. | 118/715 |
| 5,810,937 | 9/1998 | Gupta et al. | 134/1.2 |

FOREIGN PATENT DOCUMENTS 43-12248  8/1965  Japan .

Primary Examiner—Richard Bueker
Assistant Examiner—Erin Fieler
Attorney, Agent, or Firm—Townsend & Townsend & Crew

[57] ABSTRACT

An apparatus for processing substrates that is configured for a cleaning operation by loading a cleaning process wafer onto the susceptor before forming a cleaning plasma in the processing chamber. In one embodiment, a ceramic wafer is chosen to have a dielectric value sufficient to alter the electromagnetic field of the plasma, and spreads the plasma away from the susceptor during a cleaning operation, thus reducing damage to the susceptor. The plasma may be directed towards the walls of the chamber to reduce chamber cleaning time.

13 Claims, 3 Drawing Sheets

SUBSTRATE PROCESSING SYSTEM CONFIGURABLE FOR DEPOSITION OR CLEANING

BACKGROUND OF THE INVENTION

The present invention relates to methods and apparatus for cleaning a chemical vapor deposition (CVD) chamber.

During CVD processing, the reactant gases can create compositions which deposit upon the inside surfaces of the chamber. As these deposits build up, the residues can flake off and contaminate future processing steps. Such residue deposits can also adversely affect other processing conditions such as deposition uniformity, deposition rate, film strength and the like.

Accordingly, processing chambers are typically periodically cleaned to remove the residue material. Typically, the use of etching gases is used to clean the chamber after each process or after a few processes are run through the chamber. After longer periods of time, typically 1000–2000 wafers, the chamber is opened up and cleaned by hand using rinse water and clean wipes. Clearly, it is desirable to minimize the amount of cleaning time required in order to improve the throughput of wafers through the processing chamber.

The cleaning using the cleaning gases typically involves a plasma enhanced dry cleaning technique. These techniques require a separate process step which requires introducing the cleaning gases into the chamber, striking a plasma from the cleaning gases, and using the plasma to remove contaminant residues. Typically, fluorine is used as a cleaning gas species. Descriptions of such a cleaning process may be found, for instance, in U.S. Pat. Nos. 4,960,488 and 5,124,958, assigned to Applied Materials, Inc.

A disadvantage of the dry cleaning operation is that it contributes to the degradation of the wafer support, such as a susceptor, which is typically made of aluminum. A susceptor typically has an anodized layer on its surface, which forms some protection. However, during a plasma cleaning process, the fluorine chemistry of a conventional cleaning process can penetrate an anodized layer and cause the formation of aluminum fluoride. This usually occurs at point defect sites in the anodized layer, which results in the formation of nodules, cracks, and delamination. This formation of aluminum fluoride or other compounds can cause uniformity and particle problems on process wafers subsequently placed on the wafer support.

One method for addressing the above degradation of a susceptor is to use a two step cleaning process, as set forth in U.S. Pat. No. 5,158,644, assigned to Applied Materials, Inc. In that two step process, the chamber is first cleaned in an extended state in which the susceptor is lowered to be well spaced from the gas discharge manifold, thus limiting the amount of plasma reaching the susceptor by decreasing the plasma due to the distance between the susceptor and the gas discharge head. With this configuration, the plasma will be somewhat redirected to the grounded walls of the chamber to effect cleaning there. In a second step, the susceptor is moved back up close to the gas discharge head for cleaning of the susceptor itself. The two step process reduces the amount of time the susceptor is exposed to a high intensity plasma.

SUMMARY OF THE INVENTION

The present invention provides a method and apparatus for reducing plasma cleaning process time while protecting the wafer support during a cleaning operation by loading a ceramic wafer onto the wafer support before introducing the cleaning agent into the chamber. In particular, the ceramic wafer is chosen to have a dielectric value sufficient to alter the electromagnetic field to spread the plasma away from a susceptor during a cleaning operation, directing more of the plasma towards the walls of the chamber.

The introduction of the cleaning wafer into the chamber reduces wafer throughput by adding the time required to load the ceramic wafer and then unload after the cleaning process. However, the cleaning wafer redirects the cleaning plasma towards portions of the chamber requiring greater cleaning, thus reducing the cleaning time, and more than making up for the amount of time required for loading and unloading the ceramic wafer. The use of the present invention also increases the lifetime of the wafer support, such as a susceptor, thereby reducing maintenance costs and down time of substrate processing system, thus increasing wafer throughput.

For a fuller understanding of the objects and advantages of the invention, reference should be made to the ensuing detailed description taken in conjunction with the accompanying drawings.

DESCRIPTION OF THE SPECIFIC EMBODIMENT

Figure 1:
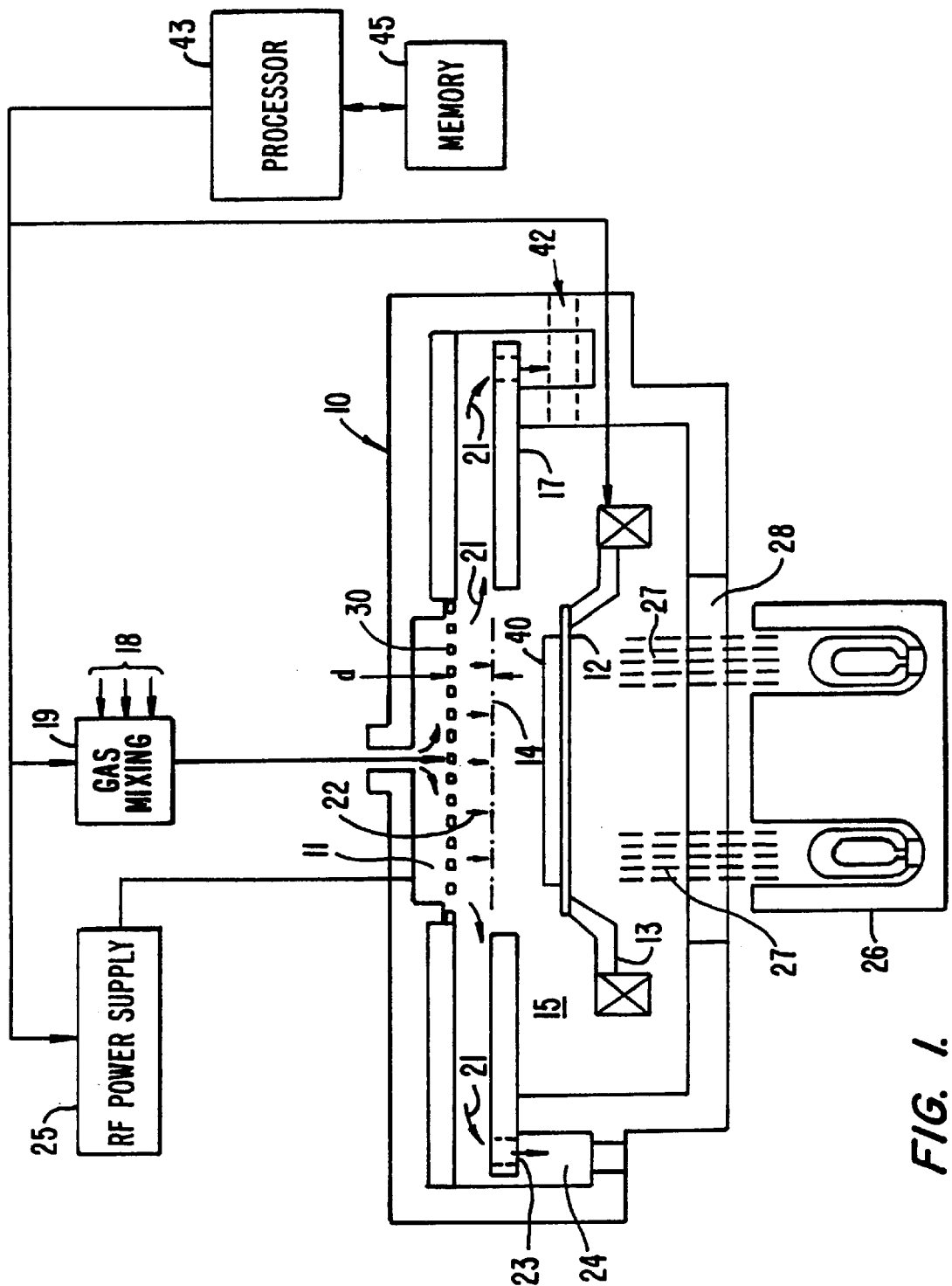
FIG. 1 is a sectional diagram of a processing chamber including the ceramic wafer of the present invention.

One suitable CVD machine in which the method of the present invention can be carried out in is shown in FIG. 1 which is a vertical, cross-sectional view of a simplified, parallel plate chemical vapor deposition reactor 10 having a vacuum chamber 15. Reactor 10 contains a gas inlet manifold 11 for dispersing deposition gases to a wafer that rests on a susceptor 12. Susceptor 12 is highly thermally responsive and is mounted on a support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. During processing, gas inlet to manifold 11 is uniformly distributed radially across the surface of the wafer as indicated by arrows 21. The gas is then exhausted via ports 23 into the circular vacuum manifold 24 by a vacuum pump system (not shown). Before reaching manifold 11, deposition and carrier gases are input through gas lines 18 into a mixing chamber 19 where they are combined and then sent to manifold 11.

The deposition process performed in reactor 10 can be either a thermal process or a plasma-enhanced process. In a plasma process, a controlled plasma is formed adjacent to the wafer by RF energy applied to inlet manifold 11 from RF power supply 25. Inlet manifold 11 is also an RF electrode, while susceptor 12 is grounded. RF power supply 25 can supply either single or dual frequency RF power to manifold 11 to enhance the decomposition of reactive species introduced into chamber 15.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition. Other heating techniques, such as heating a susceptor with RF or microwave energy, or incorporating an electric-resistive heater into a wafer support platform, could be used.

Typically, any or all of the chamber lining, gas inlet manifold faceplate, support fingers 13, and various other reactor hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention, which is incorporated herein by reference for all purposes.

A cleaning process wafer 40 is shown placed on susceptor 12. The cleaning process wafer is made of alumina ($Al_2O_3$) and is approximately 40 mils thick. Other material, such as an aluminum nitride wafer, a hollow ceramic wafer, or a coated wafer, such as a silica wafer coated with alumina, could be used. The cleaning process wafer will protect susceptor 12 from fluorine plasma species formed from a cleaning gas injected into the chamber through gas mixer 19 during a cleaning operation. The cleaning process wafer acts as a dielectric, limiting the RF field between manifold 11 and susceptor 12, thus spreading the plasma and redirecting the plasma towards the walls of the chamber and other aspects of the chamber which need to be cleaned. It has been observed in experimental results that this spreading effect reduces the needed cleaning time by 50%.

A processor 43 under the control of a program stored in a memory 45 controls the operation of the chamber of FIG. 1, including the RF power supply 25, the gas mixing system 19, and the raising and lowering of susceptor 12. The processor can also control the insertion and removal of the cleaning process wafer via the apparatus shown in FIG. 2.

Figure 2:
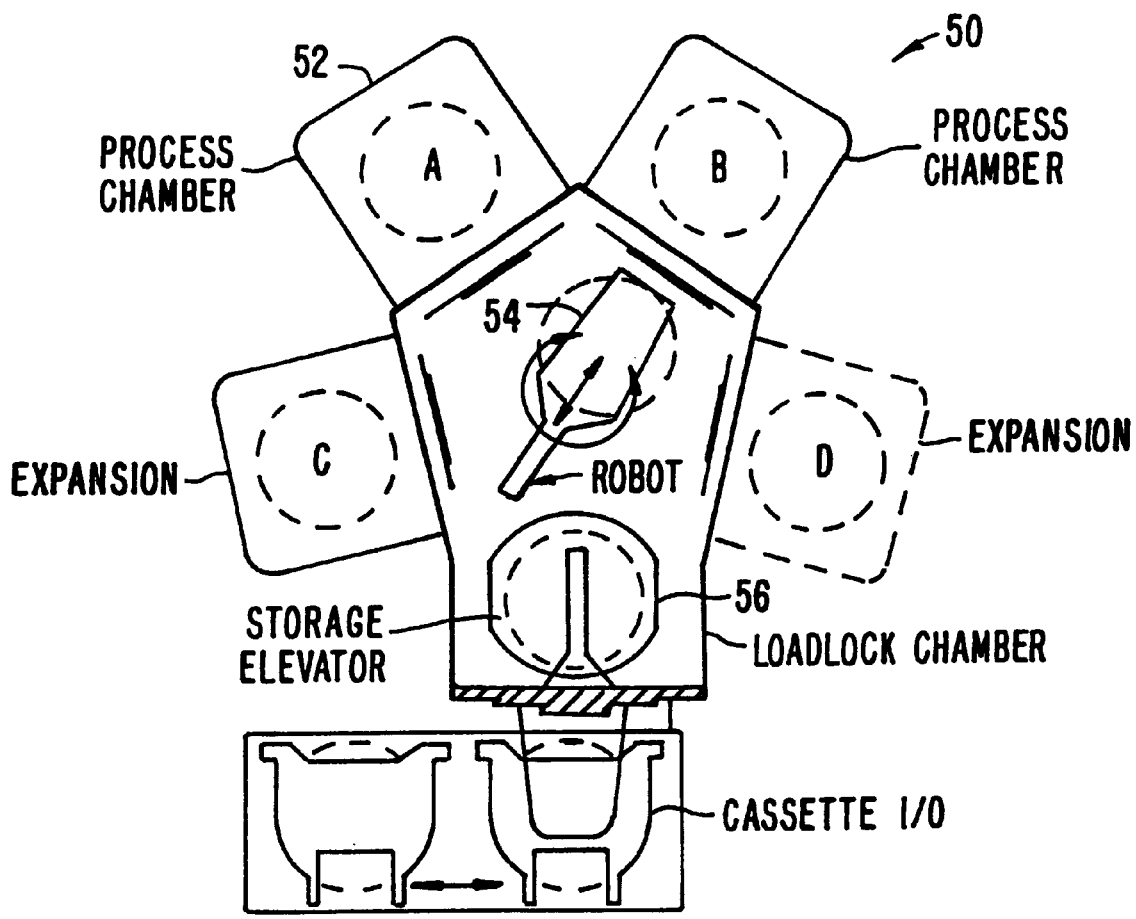
FIG. 2 is a diagram illustrating the robot and wafer storage elevator for handling the ceramic wafer of the present invention.

FIG. 2 shows a diagram of the apparatus for loading the cleaning process wafer of the present invention and storing it between uses. FIG. 2 shows a processing system 50 which includes a process chamber 52, such as the one shown in FIG. 1. A robot arm 54 is used to load a cleaning process wafer from a storage elevator 56. Storage elevator 56 holds a number of wafers, such a process wafers, in-between process steps, and can also be used to hold the cleaning process wafer of the present invention. The storage elevator may hold several similar cleaning process wafers, or various cleaning process wafers that are selectable for various cleaning operations. The cleaning process wafer is transferred by the robot arm 54 between process chamber 52 and storage elevator 56.

Figure 3:
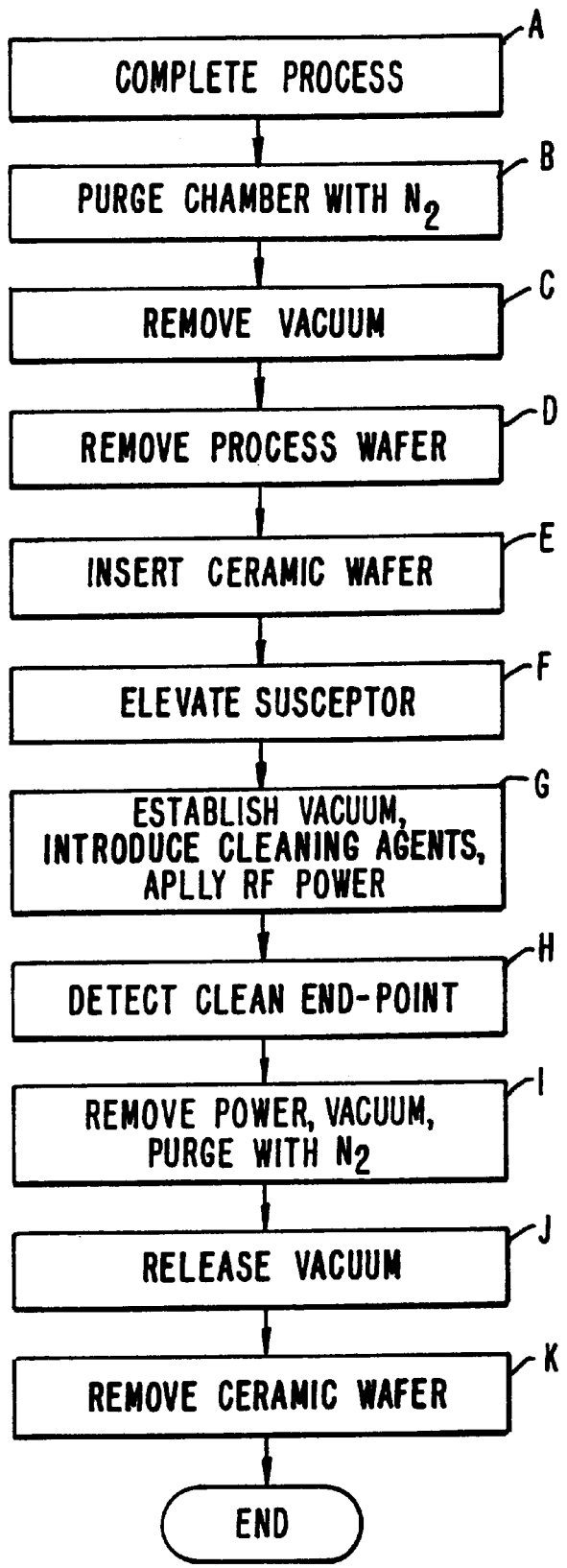
FIG. 3 is a flowchart illustrating the cleaning process of the present invention.

FIG. 3 is a flowchart illustrating the steps of the cleaning operation according to the present invention. These steps may be controlled by processor 43 pursuant to a program in memory 45. After a final processing step on a processing wafer is completed and the RF power is turned off by a command from processor 43 to RF Power Supply 25 (step A), the chamber is purged with an inert gas, such as nitrogen, by control of appropriate valves in gas mixing system 19 in response to a command from processor 43 (step B). After the last of the purge gases has been removed by the vacuum pump, the vacuum is turned off by controlling a vacuum valve with processor 43 (step C) and the process wafer is removed from the chamber (step D) by robot 54 in response to a command from the processor and placed in storage elevator 56.

A cleaning process wafer 40 is then retrieved from storage elevator 56 by robot arm 54 and placed into chamber 52 (step E). The wafer is inserted through a slot 42 in the side of the chamber of FIG. 1. The susceptor is then elevated to the desired height for the cleaning plasma by a motor controlled by the processor (step F) and the cleaning agents, typically including fluorine, are introduced into the chamber (step G) under the appropriate pressure and temperature conditions, as directed by commands from the processor to the gas mixing system, vacuum throttle valve and susceptor heater. RF power is applied to form a cleaning plasma from the cleaning agent in the chamber.

An end point detector for detecting light emissions from fluorine gas is used to determine the end of the cleaning operation (step H). Alternately, a timed clean could be used. After the clean has been completed and the RF power turned off, again, an inert gas, such as nitrogen, is used to purge the chamber (step 1). The vacuum is turned off (step 3) and the cleaning process wafer is removed from the chamber (step K).

The cleaning process can be varied in a number of ways while still using the concepts of the present invention. For instance, a two step process could be used as set forth in U.S. Pat. No. 5,158,644, the disclosure of which is incorporated herein by reference. In such a two step process, the susceptor is in the lowered position with the ceramic wafer and subject to a first cleaning operation. Subsequently, the cleaning process wafer is removed, with the susceptor being raised closer to the gas discharge head for a second, local cleaning operation. In one embodiment, the two step cleaning process might be utilized only for periodic cleans, with a single step process being used for most of the cleans, or vice versa, or different cleaning process wafers may be used for different cleaning processes.

The thickness and dielectric constant of the ceramic wafer can be varied in accordance with the chamber to be cleaned. In particular, if the chamber walls are covered with a ceramic liner, such as than set forth in U.S. Pat. No. 5,366,585, assigned to Applied Materials, Inc., the ceramic will need to be thicker, or have a lower dielectric constant, than a ceramic wafer used for an unlined chamber. This is because the ceramic liner directs the plasma away from the walls in such a lined chamber, and accordingly the ceramic wafer needs to be thicker or have a lower dielectric constant to redirect the plasma back to the walls, overcoming the insulating feature of the ceramic liner.

In the preferred embodiment, the ceramic wafer is 40 mils thick alumnia ($Al_2O_3$), and has a diameter equal to that of the wafers being processed. For instance, if 8" wafers are being processed, an 8" ceramic wafer will be used.

Preferably, the ceramic wafer of the present invention is itself periodically replaced or cleaned to avoid its introducing contaminants into the chamber during the cleaning process due to residue build up on the ceramic wafer. However, in some systems thousands of cleaning operations can be performed without such a wafer cleaning or replacement being necessary.

As will be understood by those of skill in the art, the present invention may be embodied in other specific forms without departing from the spirit or essential characteristics thereof. For example, a wafer which is only partially ceramic, has a ceramic coating, or has some other alloy or material which has dielectric properties similar to ceramic could be used. The dielectric constant of the ceramic wafer and its thickness could be varied not only in accordance with the chamber characteristics, but also with the height of the susceptor used during the plasma cleaning process. Although the described embodiment is a CVD chamber, the invention could apply to any chamber where deposits build up, such as an etching chamber, for example, and could be applied to plasma cleaning processes using other than fluorine chemistry, and to wafer supports made of material other than anodized aluminum. Accordingly, the above embodiments are meant to be illustrative of the present invention, but reference should be made to the ensuing claims which set forth the scope of the present invention.

What is claimed is:

1. A chemical deposition system configurable to clean a processing chamber of the chemical deposition system, the chemical deposition system comprising:
   a wafer support mounted in said processing chamber for supporting wafers;
   a gas discharge head for introducing a cleaning into said chamber;
   a plasma-generating system capable of forming a plasma from a cleaning agent in said chamber; and a cleaning process wafer adapted for loading onto said wafer support, said cleaning process wafer having a dielectric constant capable of spreading said plasma formed from said cleaning agent by said plasma-generating system when said cleaning process wafer is on said wafer support.

2. The system of claim 1 wherein said cleaning process wafer directs the plasma formed in said chamber during a cleaning process toward walls of said chamber.

3. The system of claim 1 wherein said chamber includes walls lined with a ceramic liner, and wherein said cleaning process wafer has a dielectric constant sufficient to direct said plasma toward said ceramic liner.

4. The system of claim 1 wherein said chamber further includes a ceramic shield over said wafer support, and wherein said dielectric constant of said cleaning process wafer combined with a second dielectric constant of said ceramic shield, directs said plasma toward said ceramic liner.

5. The system of claim 1 wherein said wafer support is a susceptor.

6. The system of claim 5 wherein said susceptor comprises anodized aluminum.

7. The system of claim 1 wherein said cleaning process wafer has a dielectric constant sufficient to reduce the amount of time required to clean said chamber with said cleaning process wafer from the amount of time required to clean said chamber without said cleaning process wafer more than the amount of time required to load and unload said cleaning process wafer onto said susceptor.

8. The system of claim 1 wherein said cleaning process wafer comprises $Al_2O_3$.

9. The system of claim 1 further comprising:
   a wafer elevator having a plurality of slots for holding wafers, including said cleaning process wafer; and
   a robot arm for moving said cleaning process wafer between said susceptor and said wafer elevator.

10. The system of claim 1 wherein said cleaning process wafer has a diameter essentially equal to a process-wafer diameter.

11. A chemical deposition system configurable to clean a processing chamber of the chemical deposition system, the chemical deposition system comprising:
    a susceptor for supporting wafers mounted in said chamber;
    a gas discharge head for introducing a cleaning agent into said chamber;
    a plasma-generating system capable of forming a plasma from said cleaning agent in said chamber; and
    a cleaning process wafer for loading onto said susceptor, said cleaning process wafer having a dielectric constant capable of spreading said plasma formed from said cleaning agent by said plasma-generating system when said wafer is on said susceptor;
    a wafer elevator having a plurality of slots for holding wafers, including said cleaning process wafer; and
    a robot arm for moving said cleaning process wafer between said susceptor and said wafer elevator.

12. The system of claim 11 wherein said cleaning process wafer is about 40 mils thick.

13. A memory storing a program for access by a processor controlling a chemical deposition system, the program comprising:
    an instruction for removing a process wafer from a processing chamber;
    an instruction for loading a cleaning process wafer onto a susceptor in the processing chamber;
    an instruction for flowing a cleaning agent into the processing chamber; and
    an instruction for forming a plasma from the cleaning agent in the processing chamber.

* * * * *